(12) United States Patent
Lee

(10) Patent No.: US 9,007,340 B2
(45) Date of Patent: Apr. 14, 2015

(54) DISPLAY DEVICE

(71) Applicant: Samsung Display Co., Ltd., Yongin-si, Gyeonggi-do (KR)

(72) Inventor: Dong-Eup Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 143 days.

(21) Appl. No.: 13/756,395

(22) Filed: Jan. 31, 2013

(65) Prior Publication Data

US 2013/0335368 A1    Dec. 19, 2013

(30) Foreign Application Priority Data

Jun. 15, 2012    (KR) ........................ 10-2012-0064402

(51) Int. Cl.
*G06F 3/041* (2006.01)
*H01L 27/32* (2006.01)

(52) U.S. Cl.
CPC .............. *G06F 3/0412* (2013.01); *G06F 3/041* (2013.01); *G06F 2203/04103* (2013.01); *H01L 27/323* (2013.01)

(58) Field of Classification Search
USPC ........................................................ 345/174
See application file for complete search history.

(56) References Cited

U.S. PATENT DOCUMENTS 6,879,319 B2 *  4/2005  Cok ................................ 345/173
2011/0242027 A1 * 10/2011  Chang ........................... 345/173

FOREIGN PATENT DOCUMENTS

| JP | 2006-154035 A | 6/2006 |
| KR | 10-2008-0012127 | 2/2008 |
| KR | 10-2010-0044717 | 4/2010 |

* cited by examiner

*Primary Examiner* — Charles V Hicks
(74) *Attorney, Agent, or Firm* — Christie, Parker & Hale, LLP

(57) ABSTRACT

A display device includes a first substrate, a display unit located at the first substrate for displaying an image, a first pad unit coupled with the display unit and located at an end side of the first substrate in a first direction, and a second substrate on the first substrate and having an opening exposing the first pad unit, the second substrate including a protruding portion covering a portion of the first substrate and neighboring the opening in a second direction crossing the first direction, wherein the display unit is between the second substrate and the first substrate.

7 Claims, 3 Drawing Sheets

DISPLAY DEVICE

CROSS-REFERENCE TO RELATED APPLICATION

This application claims priority to and the benefit of Korean Patent Application No. 10-2012-0064402 filed in the Korean Intellectual Property Office on Jun. 15, 2012, the entire contents of which are incorporated herein by reference.

BACKGROUND

1. Field

The described technology relates generally to a display device.

2. Description of the Related Art

Of display devices that display an image, an organic light emitting diode (OLED) display has come into the spotlight in recent years. The OLED display is self-luminous and, unlike a liquid crystal display (LCD) device, does not need a separate light source, thereby reducing thickness and weight of the display device. Further, the OLED display exhibits high-quality characteristics, such as low power consumption, high luminance, and high reaction speed.

In general, the OLED display includes a first substrate, an organic light emitting diode on the first substrate, a second substrate on the first substrate, the organic light emitting diode being between the first and second substrate, and a polarizing plate attached to the second substrate.

Recently developed is an OLED display in which a capacitive touch sensor and a pad unit coupled to the touch sensor are formed at a second substrate. However, in such an OLED display, a pad unit is separated from the touch sensor (e.g., separated by a predetermined distance) to keep a polarizing plate from overlapping the pad unit.

The above information disclosed in this Background section is only for enhancement of understanding of the background of the described technology, and may therefore contain information that does not form the prior art that is already known in this country to a person of ordinary skill in the art.

SUMMARY

Embodiments of the present invention provide a display device that can reduce or minimize the overall size thereof.

One embodiment of the present invention provides a display device including a first substrate, a display unit located at the first substrate for displaying an image, a first pad unit coupled with the display unit and located at an end side of the first substrate in a first direction, and a second substrate on the first substrate and having an opening exposing the first pad unit, the second substrate including a protruding portion covering a portion of the first substrate and neighboring the opening in a second direction crossing the first direction, wherein the display unit is between the second substrate and the first substrate.

The display device may further include a touch sensor corresponding to the display unit and located at the second substrate, and a second pad unit coupled with the touch sensor and located at the protruding portion of the second substrate.

The display device may further include a polarizing plate coupled to the second substrate and located at the touch sensor while neighboring the second pad.

The polarizing plate may have an area that is larger than that of the touch sensor.

The display unit may include an organic light emitting diode.

The protruding portion may cover an end side of the first substrate in the second direction.

The protruding portion may cover a second end side of the first substrate in the second direction.

Accordingly, embodiments of the present invention enable the overall size of the display device to be reduced or minimized.

DETAILED DESCRIPTION

Figure 1:
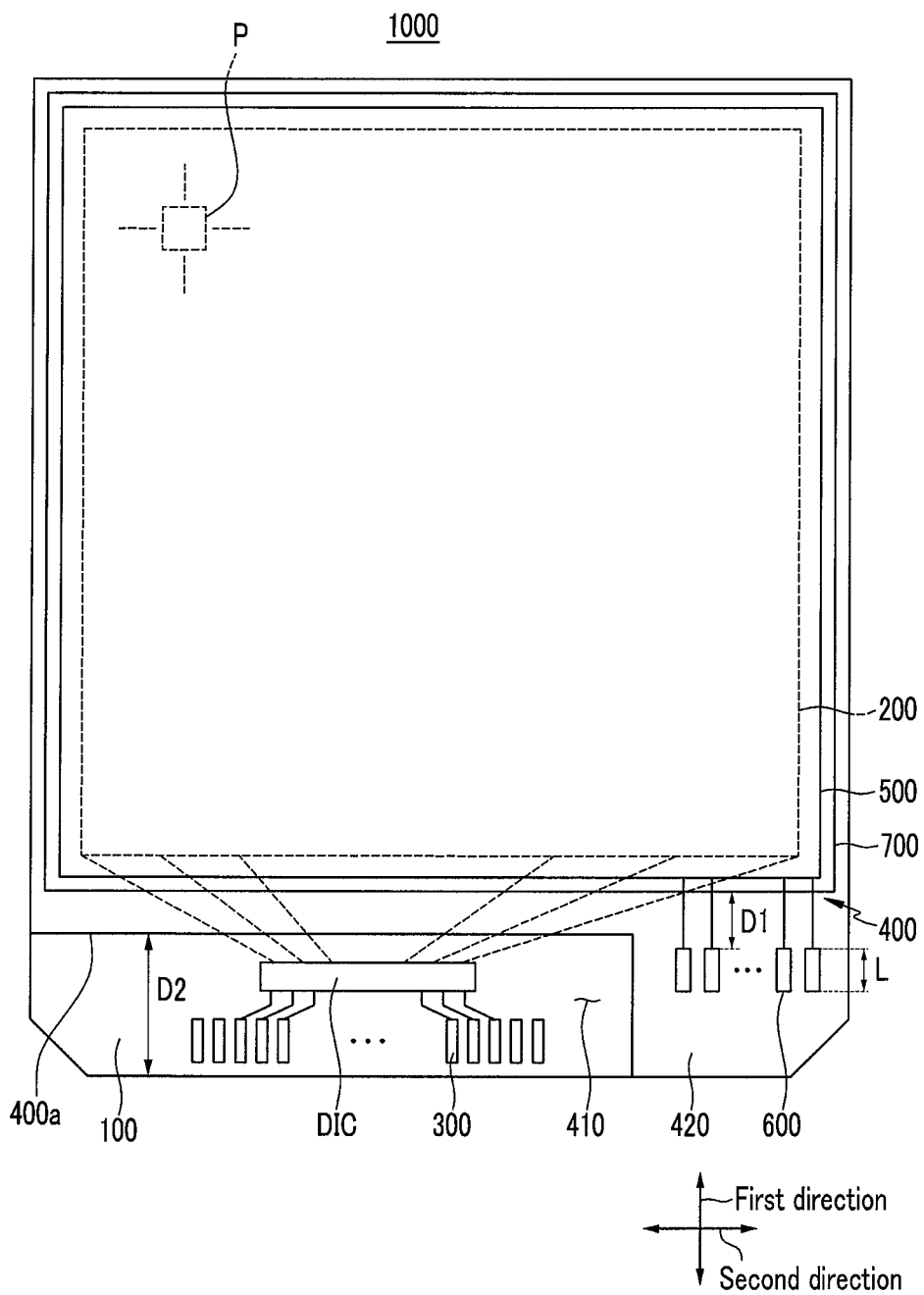
FIG. 1 shows an organic light emitting diode (OLED) display according to a first exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in several exemplary embodiments, a constituent element having the same configuration will be representatively described in a first exemplary embodiment using like reference numerals, and other configurations different from those of the first exemplary embodiment will be described in other exemplary embodiments.

In addition, the size and thickness of each component shown in the drawings may be arbitrarily shown for understanding and ease of description, but the present invention is not limited thereto. In the drawings, the thickness of layers, films, panels, regions, etc., may be exaggerated for clarity, and the thickness of some layers and areas may be exaggerated. It will be understood that when an element, such as a layer, film, region, or substrate, is referred to as being "on" another element, it can be directly on the other element, or intervening elements may also be present.

In addition, unless explicitly described to the contrary, the word "comprise" and variations thereof, such as "comprises" or "comprising", will be understood to imply the inclusion of stated elements, but not the exclusion of any other elements.

Hereinafter, a display device according to a first exemplary embodiment of the present invention will be described with reference to FIG. 1 and FIG. 2. Hereinafter, as a display device, an organic light emitting diode (OLED) display including an active matrix (AM) type organic light emitting element having a 2Tr-1 Cap structure, in which each pixel of a display unit is provided with two thin film transistors (TFTs) and one capacitor, is exemplarily illustrated, although the present invention is not limited thereto. Thus, the display device may be an OLED display in which each pixel of a display unit has three or more thin film transistors and/or two or more capacitors, may be a liquid crystal display device of which a display device includes liquid crystals, or may be a plasma display panel of which a display unit includes plasma. Here, a pixel refers to a unit (e.g., a minimum unit) for displaying an image, and a display unit of the display device displays an image using a plurality of pixels.

FIG. 1 is a top plan view of a display device according to a first exemplary embodiment of the present invention. As shown in FIG. 1, a display device 1000 according to the first exemplary embodiment includes a first substrate 100, a display unit 200, a first pad unit 300, a second substrate 400, a touch sensor 500, a second pad unit 600, and a polarizing plate 700.

The first substrate 10 may be formed of an inorganic material, such as glass, may be formed of a metallic material, or may be formed of an organic material such as a resin. The first substrate 100 may transmit light or block light, and may be flexible. The display unit 200 is located on the first substrate 100, and displays an image through a plurality of pixels P. Here, the pixel is a unit (e.g., a minimum unit) for displaying an image.

Figure 2:
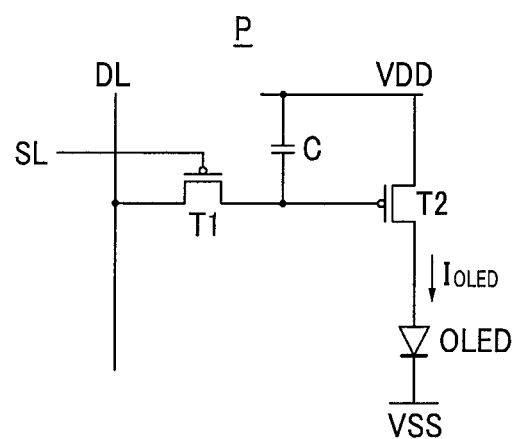
FIG. 2 is a circuit diagram of a pixel in a display unit of the embodiment shown in FIG. 1.

FIG. 2 is a circuit diagram of a pixel of the display unit of the embodiment shown in FIG. 1. As shown in FIG. 2, a pixel P includes two or more thin film transistors T1 and T2, one or more capacitors C, and an organic light emitting diode (OLED). The two or more thin film transistors basically include a switching thin film transistor T1 and a driving thin film transistor T2.

The switching thin film transistor T1 is coupled to a scan line SL and a data line DL, and transmits to the driving thin film transistor T2 a data voltage input from the data line DL according to a switching voltage input to the scan line SL. The capacitor C is coupled to the switching thin film transistor T1 and a driving power line VDD, and stores a voltage that corresponds to a difference between a voltage transmitted from the switching thin film transistor T1 and a voltage supplied to the driving power line VDD.

The driving thin film transistor T2 is coupled to the driving power line VDD and the capacitor C, and thus transmits to the organic light emitting diode OLED an output current $I_{OELD}$ that is proportional to a square of a difference between the voltage stored in the capacitor C and a threshold voltage. The organic light emitting diode OLED emits light according to the output current $I_{OLED}$ and a current supplied from a common power line VSS.

Referring back to FIG. 1, the first pad unit 300 is located at the first substrate 100 next to the display unit 200. The first pad unit 300 is located at an end side (e.g., a bottom side) in a first direction (e.g., a vertical direction) on the first substrate 100, is coupled with the display unit 200, and may have a flexible printed circuit board (FPCB) coupled thereto. A driving signal for driving the display unit 200 is supplied to the first pad unit 300 through the flexible printed circuit board FPCB, and is supplied to the display unit 200 through the first pad unit 300. A driver DIC having a circuit chip is provided between the first pad unit 300 and the display unit 200, and the driving signal supplied from the first pad unit 300 may be converted in the driver DIC and then supplied to the display unit 200. Here, the driving signal implies signals respectively supplied to the driving power line VDD, the common power line VSS, the scan line SL, and the data line DL.

Meanwhile, in the display device 1000 according to the first exemplary embodiment, the driver DIC is between the first pad unit 300 and the display unit 200. However, a driving unit may be omitted in a display device according to other exemplary embodiments, and the first pad unit 300 and the display unit 200 may be directly coupled with each other.

The second substrate 400 is on the first substrate 100 and faces the first substrate 100, interposing the display unit 200 therebetween. The second substrate 400 may be formed of an inorganic material, such as glass, may be formed of a metallic material, or may be formed of an organic material such as a resin. The second substrate 400 may transmit or block light, and may be flexible.

The second substrate 400 includes an opening 410 and a protruding portion 420. The opening 410 exposes the first pad unit 300 and the driver DIC. Since the first pad unit 300 and the driver DIC are exposed by the opening 410, the flexible printed circuit board FPCB can be simply coupled to the first pad unit 300, and the circuit chip can be installed in the driver DIC.

The protruding portion 420 neighbors the opening 410 in a second direction (e.g., a horizontal direction) that crosses the first direction, and covers a portion of the first substrate 100. The protruding portion 420 covers one end side (e.g., the right side) of the first substrate 100 in the second direction. That is, as shown in FIG. 1, one area of the second substrate 400 (e.g., the protruding portion 420) extends to a bottom right region.

The touch sensor 500 corresponding to the display unit 200 is located at the second substrate 400. The touch sensor 500 may be a capacitive touch panel formed at the second substrate 400, and wires for sensing variations of capacitance of an insulating layer due to touch are formed therein. Various wires forming the touch sensor 500 and the shape of the insulating layer touch sensor 500 are known in the art, and therefore no further description will be provided.

The second pad unit 600 is formed at the second substrate 400 next to the touch sensor 500. The second pad unit 600 is located at the protruding portion 420 of the second substrate 400, is coupled with the touch sensor 500, and may have a flexible printed circuit board FPCB coupled thereto. A sensing signal for sensing touch of the touch sensor 500 is supplied to the second pad unit 600 from an external source through the flexible printed circuit board FPCB, and is supplied to the touch sensor 500 through the second pad unit 600. The flexible printed circuit board FPCB coupled to the second pad unit 600 may be coupled with the flexible printed circuit board FPCB that is coupled to the first pad unit 300. Here, the sensing signal corresponds to signals supplied to various wires that form the touch sensor 500.

The polarizing plate 700 has an area that is larger than that of the touch sensor 500 such that the polarizing plate 700 can be attached to the second substrate 400 while covering the touch sensor 500, and may be located on the touch sensor 500 while also neighboring the second pad unit 600. The polarizing plate 700 may be formed by sequentially layering a ¼ wavelength retarder and a linear polarizing plate. Here, the ¼ wavelength retarder circularly polarizes linearly polarized light, or linearly polarizes circularly polarized light, and the linear polarizing plate linearly polarizes light to a polarization axis (e.g., a predetermined polarization axis). The polarizing plate 700 includes the sequentially layered ¼ wavelength retarder and the linear polarizing plate such that reflection of external light can be suppressed, thereby improving efficiency of an image displayed from the display unit 200.

The display device 1000 according to the first exemplary embodiment can be reduced or minimized in size, as will be described in further detail hereinafter.

First, the polarizing plate 700 is attached to the second substrate 400 to cover the touch sensor 500 located at the second substrate 400, and the polarizing plate 700 and the second pad unit 600 may be separated from each other by a first distance D1 to prevent the second pad unit 600 from being covered by the polarizing plate 700. In addition, one area of the first substrate 100 where the driver DIC and the first pad unit 300 are located should be exposed through the opening 410 by as much as a second distance D2 in the first direction.

If the opening 410 and the protruding portion 420 are not formed in the second substrate 400, and an end 400a of the second substrate 400 thus has a flat shape, the entire size of the display device 1000 is increased corresponding to the first distance D1, the length L of the second pad unit 600, and the second distance D2 along the first direction. That is, the entire size of the display device 1000 is increased by as much as the sum of the first distance D, the length L of the second pad unit 600, and the second distance D2 in the first direction.

However, in the display device 1000 according to the first exemplary embodiment, the opening 410 and the protruding portion 420 are formed at the second substrate 400, and the second pad unit 600 is provided at the protruding portion 420, and the overall size of the display device 1000 is thus increased depending on only the second distance D2 along the first direction. That is, the entire size of the display device 1000 is increased by as much as only the second distance D2 along the first direction.

As described, the display device 1000 according to the first exemplary embodiment is increased in size as much as the second distance D2 regardless of the first distance D1 and the length L of the second pad unit 600 in the first direction, and the entire size of the display device 1000 can accordingly be reduced or minimized.

In addition, in the display device 1000 according to the first exemplary embodiment, the second pad unit 600 is located at the protruding portion 420 so that the distance D1 between the polarizing plate 700 and the second pad unit 600 can be increased or maximized. Thus, interference of the polarizing plate 700 with respect to the second pad unit 600 that may occur due to reduction or minimization of the first distance D1 can be suppressed. Accordingly, manufacturing efficiency of the display device 1000 can be improved, and the manufacturing cost of the display device 1000 can thus be reduced.

Further, the display device 1000 according to the first exemplary embodiment includes the opening 410 that exposes the first pad unit 300 and an area of the first substrate 100 not covered by the protruding portion 420, and thus the thickness of the area of the display device 1000 where the protruding portion 420 is located is increased such that the protruding portion 420 reinforces strength of the first substrate 100, thereby suppressing breakage of the first substrate 100 due to external impact. That is, the strength of the entire display device 1000 can be increased so that reliability in handling of the display device 1000 can be improved.

Hereinafter, a display device according to a second exemplary embodiment of the present invention will be described with reference to FIG. 3.

Hereinafter, only characteristic parts distinguished from the first exemplary embodiment are selectively described, and the other parts of which the description is omitted have been described above with respect to the first exemplary embodiment. In the second exemplary embodiment, for better comprehension and ease of description, the same constituent elements are designated by reference numerals that are the same as those mentioned with respect to the first exemplary embodiment of the present invent.

Figure 3:
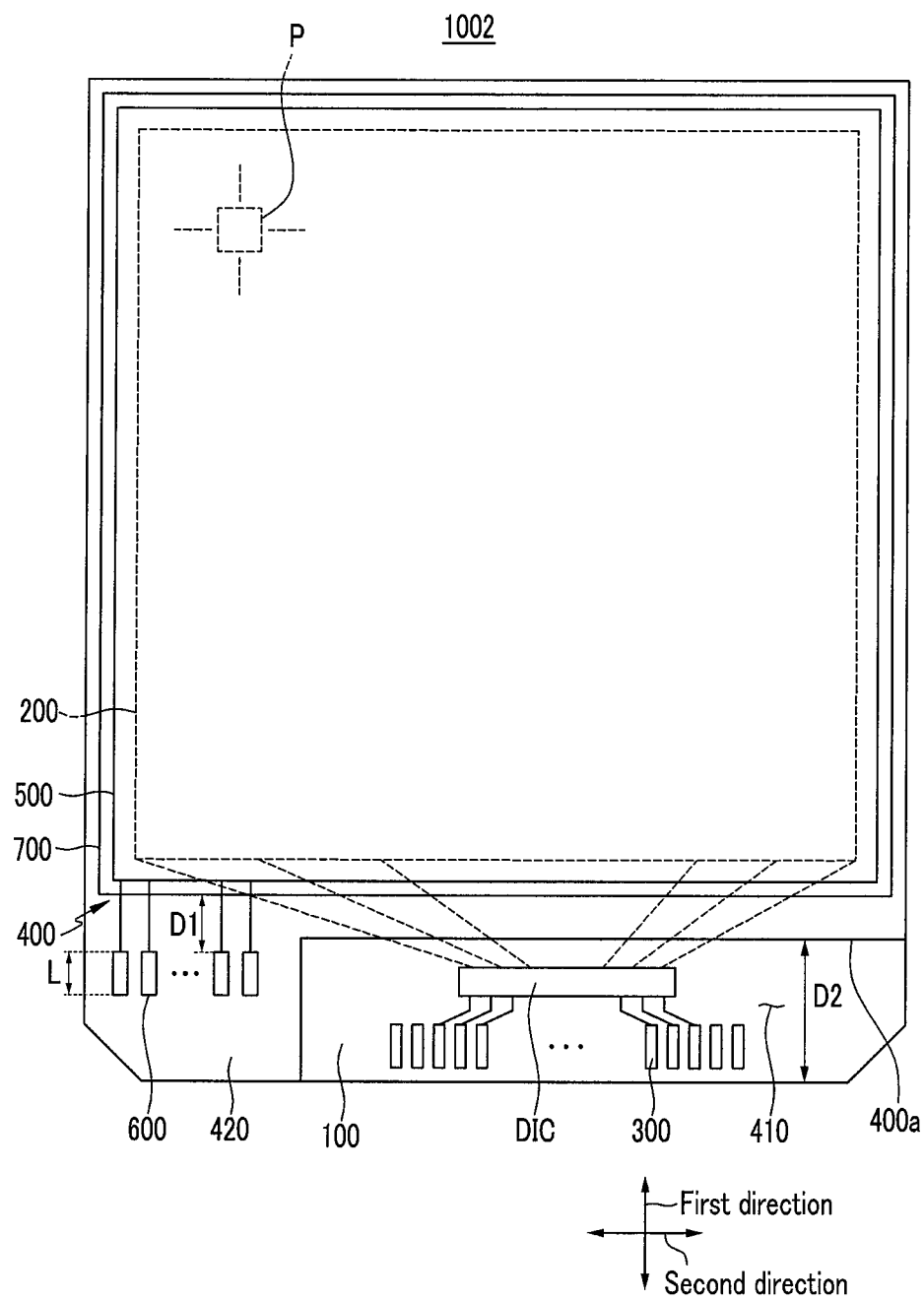
FIG. 3 shows an OLED display according to a second exemplary embodiment of the present invention.

As shown in FIG. 3, a protruding portion 420 neighbors an opening 410 in a second direction (e.g., a horizontal direction) that crosses a first direction (e.g., a vertical direction), and covers a first substrate 100. The protruding portion 420 covers a second end of the first substrate 100 in the second direction. That is, as shown in FIG. 3, one area of the second substrate 400 extends to a lower left area due to the protruding portion 420.

As described, a display device 1002 according to the second exemplary embodiment is increased in size by as much as a second distance D2 in the first direction regardless of a first distance D1 and a length L of the second pad unit 600, and accordingly, the overall size of the display device 1002 can be reduced or minimized.

In addition, in the display device 1002 according to the second exemplary embodiment, the second pad unit 600 is located at the protruding portion 420, and the first distance D1 between a polarizing plate 700 and the second pad unit 600 can be increased or maximized. Accordingly, interference of the polarizing plate 700 with respect to the second pad unit 600 that can occur due to reduction or minimization of the first distance D1 can be suppressed. This can improve manufacturing efficiency of the display device 1002 so that manufacturing cost of the display device 1002 can be reduced.

Further, since the display device 1002 according to the second exemplary embodiment includes the opening 410 exposing the first pad unit 300 and an area of the first substrate 100 not covered by the protruding portion 420, the thickness of the display device 1002 where the protruding portion 420 is provided is increased, and the protruding portion 420 thus reinforces the strength of the first substrate 100, and breakage of the first substrate 100 due to external impact can accordingly be suppressed. That is, the strength of the entire display device 1002 can be increased so that reliability in handling of the display device 1002 can be improved.

While this disclosure has been described in connection with what is presently considered to be practical exemplary embodiments of the present embodiment, it is to be understood that the invention is not limited to the disclosed embodiments, but, on the contrary, is intended to cover various modifications and equivalent arrangements included within the spirit and scope of the appended claims, and their equivalents.

Description of some of the Reference Characters
first substrate 100,
display unit 200,
first pad unit 300,
opening 410,
protruding portion 420,
second substrate 400

What is claimed is:

1. A display device comprising:
a first substrate;
a display unit located at the first substrate for displaying an image;
a first pad unit coupled with the display unit and located at an end side of the first substrate in a first direction; and
a second substrate on the first substrate and having an opening exposing the first pad unit, the second substrate comprising a protruding portion located at an end side of the second substrate in the first direction and covering a portion of the first substrate, the protruding portion neighboring the opening in a second direction crossing the first direction,
wherein the display unit is between the second substrate and the first substrate.

2. The display device of claim 1, further comprising:
a touch sensor corresponding to the display unit and located at the second substrate; and
a second pad unit coupled with the touch sensor and located at the protruding portion of the second substrate.

3. The display device of claim 2, further comprising a polarizing plate coupled to the second substrate and located at the touch sensor while neighboring the second pad.

4. The display device of claim 3, wherein the polarizing plate has an area that is larger than that of the touch sensor.

5. The display device of claim 1, wherein the display unit comprises an organic light emitting diode.

6. The display device of claim 1, wherein the protruding portion covers an end side of the first substrate in the second direction.

7. The display device of claim 1, wherein the protruding portion covers a second end side of the first substrate in the second direction.

* * * * *